United States Patent [19]

Carp et al.

[11] Patent Number: 4,878,027

[45] Date of Patent: Oct. 31, 1989

[54] DIRECT FREQUENCY SYNTHESIZER USING POWERS OF TWO SYNTHESIS TECHNIQUES

[75] Inventors: Stuart L. Carp, Menlo Park; Howard L. Swain, Palo Alto; Bich N. Nguyen, San Jose, all of Calif.

[73] Assignee: Hewlett-Packard Company, Palo Alto, Calif.

[21] Appl. No.: 81,207

[22] Filed: Aug. 3, 1987

[51] Int. Cl.[4] .......................... H03B 19/00; H03L 7/18
[52] U.S. Cl. ........................................ 328/15; 328/14; 331/40; 455/260
[58] Field of Search .................. 328/14, 15, 133, 134; 307/271; 331/1 A, 40, 16, 25; 375/81, 120; 455/260, 165, 183, 314

[56] References Cited

U.S. PATENT DOCUMENTS

| | | | |
|---|---|---|---|
| 3,702,441 | 11/1972 | Thrower | 328/14 |
| 3,838,355 | 9/1974 | Papaieck | 331/39 |
| 3,882,403 | 5/1975 | Gerken | 328/14 |
| 4,008,443 | 2/1977 | Rémy | 328/14 |
| 4,185,247 | 1/1980 | Harrison, Jr. | 328/14 |
| 4,272,730 | 6/1981 | Digiovanni | 331/16 |
| 4,425,552 | 1/1984 | Stirling | 331/39 |
| 4,472,820 | 9/1984 | Borras | 331/1 A |

OTHER PUBLICATIONS

Stirling, "Microwave Frequency Synthesizers", Prentice—Hall, Inc., Englewood Cliffs, N.J., 1987, pp. 44–53.
Noordanus, IEEE Trans. on Comm. Tech., "Frequency Synthesizers—A Survey of Techniques", (Apr. 1969), vol. Com—17, No. 2, pp. 257–271.
Hassun, Microwaves & RF, "The Common Denominators in Fractional N", (Jun. 1984), pp. 107–110.
Gibbs et al., Electronics, "Frequency Domain Yields its Data to Phase-Locked Synthesizer", (Apr. 27, 1978), pp. 107–113.
Rauvola, Microwave Systems News, "Advanced Frequency Synthesizer Developed for Radar and Communications Applications" (Jan. 1987), pp. 8–12.
An Advertisement of John Fluke Manufacturing Company entitled "The History of General Purpose Frequency Synthesizers" (1982).
Hosking, Electronic Products Magazine, "Frequency Synthesizers—Direct, Indirect or Direct Digital?" (Dec. 17, 1973), pp. 115–123.
Cooper, Electronic Design, "Why Complicate Frequency Syntehsis?" (Jul. 19, 1974), pp. 80–84.
Oliver, Hewlett–Packard Journal, "A 0–50 Mc Frequency Synthesizer with Excellent Stability, Fast Switching, and Fine Resolution", (May 1964), pp. 1–6.
Tykulsky, Hewlett Packard Journal, "Digital Frequency Synthesizer Covering 0.1 MHz to 500 MHz in 0.1 Hz Steps" (Oct. 1967), pp. 10–16.

(List continued on next page.)

*Primary Examiner*—Stanley D. Miller
*Assistant Examiner*—Timothy P. Callahan

[57] ABSTRACT

A fast switching broadband signal synthesizer method and structure are provided which not only has the ability to change frequency and amplitude quickly, but with a minimal dwell time required before switching can again take place. A signal translator can also be constructed in accordance with this invention in order to convert the output frequency of a companion signal source to any desired frequency while retaining the fast switching speed and switching rate of the signal synthesizer. Amplitude, phase, and frequency modulation of the companion signal are preserved during the translation process. A direct frequency synthesizer is provided wherein internal signals which are combined to generate any output frequency are derived from a single fixed frequency oscillator. By utilizing a single reference frequency oscillator in accordance with this invention, the amount of circuitry required to construct a direct frequency synthesizer is greatly reduced. Because all internal signals are derived from one reference frequency oscillator, the close-in-phase noise of the internal signals are correlated, thus providing an output signal having low phase noise. All internal frequency increments and number of frequency selector switch positions have numerical values that are an exact-power-of-two.

24 Claims, 4 Drawing Sheets

OTHER PUBLICATIONS

Oropeza et al., Frequency, "Binary Frequency Synthesis: Spectral Purity with Economic Simplicity", (Sep./Oct. 1966).

Feinberg, r.f. design, "Multiple Synthesis Techniques Optimize Instrument's Performance" (May/Jun. 1984), pp. 21–41.

Gilette, Communications Designer's Digest, "VLF Output, Low Noise Phase Noise Make Synthesizer Attractive Test Tool", (Aug. 1969), pp. 46–49.

Rhode et al., r.f. design, "Low-Noise Frequency Synthesizers Using Fractional N Phase-Locked Loops", (Jan./Feb. 1981), pp. 20–34.

Fogarty, Computer Design, "Digital Synthesizers Produce Wide Frequency Range from Single Source", (Jul. 1975), pages 100 et seq.

Papaieck, Microwave Journal, "A Submicrosecond Switching Frequency Synthesizer to 4 GHz" (Dec. 1985), pp. 133–136.

Fast Switching Microwave Frequency Synthesizer, R. C. Stirling.

DIRECT FREQUENCY SYNTHESIZER USING POWERS OF TWO SYNTHESIS TECHNIQUES

BACKGROUND OF THE INVENTION

This invention deals with a method and structure for providing a signal which can rapidly switch among many frequencies.

Prior art attempts to provide a signal source that can rapidly switch among many frequencies have various disadvantages.

Multiple continuously running fixed frequency oscillators connected to an electronic switch for signal selection have been used when only a few output frequencies are required. This is impractical when many different output frequencies are needed. Also, the desired output frequencies must be known in advance—a severe disadvantage in applications such as electronic warfare (EW) jamming. When using multiple continuously running fixed frequency oscillators to generate output signals of accurate frequency, each oscillator must be separately synchronized to a reference frequency.

Slow switching signal sources have been multiplexed by means of fast electronic switches in order to select one signal source at a time. Off-line signal sources can change frequency and settle before they are selected by the switches. Unfortunately, multiplexed slow switching signal sources is an expensive and bulky solution. While this method can provide fast transitions from one frequency to another, it does not have the capability to switch often. Each signal source must dwell at a given frequency until its output signal has settled before its output signal becomes usable, thus limiting the frequency switching rate.

A phase lock loop indirect frequency synthesizer is capable of generating many frequencies, but has limited switching speed due to acquisiton, loop bandwidth, noise, and spurious signal considerations. Many phase lock loop frequency synthesizers require programable digital frequency dividers, which provide synthesizers which do not have phase memory. Phase memory is the ability to generate a signal, interrupt it, and at some later time again provide the signal having a phase indistinguishable from the phase the signal would have if the signal had been continuously present.

Mix-and-divide direct frequency synthesizers can be designed to switch frequency quickly. However, prior art methods of decoding frequency selection data to provide the necessary internal control signals are slow and rather complicated. Also, mix-and-divide direct frequency synthesizers do not have phase memory, since the signals driving the digital frequency divider circuits are interrupted during switching. The number of cycles of the interrupted signals which are missed due to switching is unknown. This undetermined time delay provides an uncertainty in the phase of the output signal.

Relevent prior art includes U.S. Pat. No. 3,838,355, "Frequency Synthesizers-A Survey of Techniques," Noordanus, IEEE Transactions on Communication Technology, Vol. Com-17, No. 2, April 1969, pp. 257-271; "A Submicrosecond Switching Frequency Synthesizer to 4 GHz," Papaieck, Microwave Journal, December 1975, pp. 133-136; "A 0-50 Mc Frequency Synthesizer with Excellent Stability Fast Switching, and Fine Resolution," Hewlett-Packard Journal, Vol. 15, No. 9, May 1964, pp. 1-6; "Digital Frequency Synthesizer Covering 0.1 MHz-500 MHz in 0.1 Hz Steps," Tykulsky, Hewlett-Packard Journal, Vol. 19, No. 2, October 1967, pp. 10-16: "Binary Frequency Synthesis: Signal Purity with Economic Simplicity," Oropeza, et al., Frequency, September-October 1966; "Multiple Synthesis Techniques Optimized Instrument's Performance," Feinberg, RF Design, May/June 1984, pp. 21-40; U.S. Pat. No. 4,272,730; "An Advanced Frequency Synthesizer Developed for Radar and Communications Applications," Rauvola, Microwave Systems News and Communications Technology, Vol. 17, No. 1, January 1987, pp. 8-12; an advertisement of John Fluke Manufacturing Company entitled, "The History of General Purpose Frequency Synthesizers," 1982; "Frequency Synthesizers-Direct, Indirect, or Direct Digital?," Hosking, Electronic Products Magazine, December 17, 1973, pp. 115-123; and "Why Complicate Frequency Synthesis?," Cooper, Electronic Design 15, July 19, 1974, pp. 80-84.

SUMMARY

In accordance with the teachings of this invention, a fast switching broadband signal synthesizer method and structure are provided which not only has the ability to change frequency and amplitude quickly, but with a minimal dwell time required before switching can again take place. Thus, the transition is fast and the switching rate can be high. The teachings of this invention can be used to generate a signal anywhere from very low frequencies through microwave frequencies. A signal translator can also be constructed in accordance with this invention in order to convert the output frequency of a companion signal source to any desired frequency while retaining the fast switching speed and switching rate of the signal synthesizer. Amplitude, phase, and frequency modulation of the companion signal are preserved during the translation process.

The teachings of the invention solve the problem of generating a signal that can change frequency and amplitude extremely fast, without sacrificing signal spectral purity, while maintaining phase memory. Phase noise of the desired signal and ultimate noise floor are comparable to the performance of prior art signal sources that switch ten to one thousand times slower.

In accordance with the teachings of this invention, a direct frequency synthesizer is provided wherein internal signals which are combined to generate any output frequency are derived from a single fixed frequency oscillator. To achieve extreme frequency accuracy this fixed frequency oscillator can be locked to a stable reference frequency, for example by using a phase lock loop. Since this phase lock loop, if used, serves to lock onto the stable reference frequency, the phase lock loop is not switching between frequencies, and thus the switching speed of the output signal is not affected by the use of this phase lock loop. By utilizing a single reference frequency oscillator in accordance with the teachings of this invention, the amount of circuitry required to construct a direct frequency synthesizer is greatly reduced over the prior art. The multiple oscillators and their attendant synchronizing circuitry of prior art circuits are eliminated with an attendant improvement in reliability since there are no phase lock loops to lose lock.

Of importance, because all internal signals are derived from one reference frequency oscillator, the close-in phase noises (i.e., the phase noises of sidebands having carrier offsets up to hundreds of KHz) of the internal signals are correlated, thus providing an output signal having low phase noise. The output signal has the close-in phase noise performance of the single reference frequency oscillator scaled by the ratio of the frequencies of the output signal and oscillator signal. The frequency accuracy of the output signal is that of the reference frequency oscillator scaled by the same ratio.

All internal signals necessary to generate the output signal of any desired frequency are present simultaneously and continuously within the structure of this invention, since all frequency divider circuits operate continuously. To generate an output signal having a specific frequency, the appropriate internal signals are selected by electronic switches, combined in mixers, and applied to frequency selective filters. The frequency divider, amplifier and filter circuitry that generate the internal signals for combination all operate under steady state conditions. This has two advantages. First, narrowband filters can be used to reduce the level of spurious signals without affecting switching speed. The slow transient response of these filters is immaterial, since they are operating in a steady state condition. Secondly, the uninterrupted operation of the frequency dividers results in phase memory of the output signal. The frequency selector switches have no effect on the phase of the internal signals. If the frequency selector switches are first set in a particular combination to generate an output signal having a first frequency, and then changed to one or more other settings to select one or more other output frequencies, and then returned to the first setting, the output signal will return to the first frequency having a phase the same as if the frequency of the output signal had not been changed from the first frequency.

Prudent choice of the specific frequencies to be combined allows all switches, amplifiers, mixers and filters that must operate with transient signals to be wideband circuits, allowing fast frequency transition, and a high switching rate.

In one embodiment of the invention, the output signal frequency is selected by means of a multiple bit digital control word. If desired, some of the bits are used to represent information other than frequency—for example, output signal amplitude or the frequency of a variable frequency signal used with fixed frequency signals in order to provide the output signal. The data may be provided by various means, including a digital computer or suitable switches.

The digital frequency data is most easily expressed as a binary number equal to the value of the desired frequency, which in turn controls internal signal selector switches. In accordance with the teachings of this invention, a novel frequency plan is used in order to allow very fast, yet simple, circuitry to be used to decode the control data into electronic switch control signals. The data bits are used without the need to convert to or from base ten or binarycoded-decimal (BCD) arithmetic.

In accordance with the teaching of this invention, all internal frequency increments and number of switch positions have numerical values that are an exact-power-of-two. That is, they can be expressed as $2^N$, where N is an integer than can be negative, zero, or positive. It is important to make the distinction between numbers that are exact-powers-of-two and binary numbers. For example, five in binary is 101. But five is not an exact-power-of-two, as there is no integer N that satisfies the equation $2^N = 5$. However, any number that is an exact-power-of-two can be expressed in binary representation, being merely a "one" followed by N zeros. One, two and thirty-two are all numbers that are an exact-power-of-two. The simple binary form of numbers which are exact powers of two is used to advantage in the method and structure of this invention.

Prior art synthesizers have typically been based upon powers-of-ten, binary-coded decimal (BCD) or some other arbitrary system of arithmetic. The literature concerning direct frequency synthesis contains references to binary synthesis. In such contexts "binary synthesis" refers to a method in which there exist signal mixing blocks having at one input a selection between two (and only two) frequencies. The spacing between the frequencies (the "increment") has no specific relation to an exact-power-of-two. With only two signals to select between, many such blocks must be combined in order to synthesize a large number of possible output frequencies.

In contrast to such prior art "binary" methods, in accordance with the teachings of this invention, there is no restriction to two frequencies per block, and the increments are uniquely related to exact-powers-of-two. The result is fewer such blocks, high switching rates and simplified external digital control.

DETAILED DESCRIPTION

Figure 1:
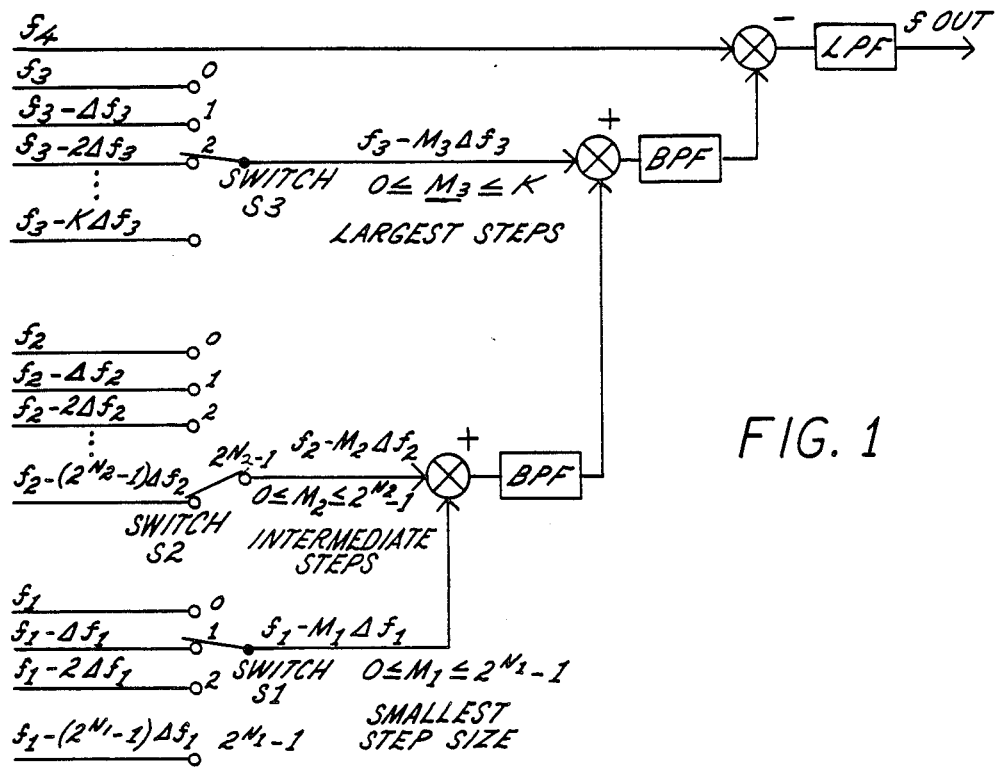
FIG. 1 is a block diagram of a direct frequency synthesizer constructed in accordance with the teachings of this invention.

FIG. 1 is a block diagram of a direct frequency synthesizer constructed in accordance with the teachings of this invention, which consists of a plurality of signal sources, switches, mixers, and filters. The various internal signals are selected in combinations as required to generate the desired output frequency Fout. These internal signals are all derived from one fixed-frequency reference oscillator, as is described later.

In accordance with this invention, specific and novel relationships exist between the various step sizes and numbers of switch positions in FIG. 1. Each switch selects one of several signals. The number of selections available at any given switch is an exact-power-of-two:
$N_{sw} = 2^{Ni}$,
where
  Ni is an integer greater than or equal to zero: and
  $N_{sw}$ is the number of switch selections.

The frequencies present at any one switch are incremented by a numerical value that is an exact-power-of-two Hertz:
$\Delta Fi = 2^D$ Hz, where
  D is an integer wn:cn :s either negative, zero, or positive: and
  $\Delta Fi$ is the frequency increment of the ith switch.

The value of the frequency increment varies from switch to switch. Let ΔF1 be the smallest frequency increment. If there are $2^{N_1}$ frequencies available at switch S1, then there are $2^{N_1}-1$ increments of ΔF1. The next larger frequency increment is $\Delta F2 = 2^{N_1}\Delta F1$. There are $2^{N_2}$ frequencies and $2^{N_2}-1$ increments of ΔF2 available for selection by switch S2. Similarly the next larger frequency increment is $\Delta F3 = 2^{N_2}\Delta F2$. This is continued until frequency sufficient range and resolution are achieved, resulting in continuous frequency coverage with equal frequency increments.

The number of positions can vary from switch to slitch, however for each switch the number of positions must be an exact-power-of-two. The switch for the largest frequency increment is the one exception in that it may have any number of positions K, without affecting the advantages of exact-powers-of-two synthesis of this invention. This is demonstrated by the specific example of FIG. 1 in conjunction with Table I.

TABLE I

| Switch | Step Size | Number of Switch Positions | Frequency Provided |
|---|---|---|---|
| S1 | smallest: ΔF1 | $2^{N_1}$ | F1 − M1ΔF1; where $0 \leq M1 \leq 2^{N_1}-1$ |
| S2 | intermediate: $\Delta F2 = 2^{N_1}\Delta F1$ | $2^{N_2}$ | F2 − M2ΔF2; where $0 \leq M2 \leq 2^{N_2}-1$, |
| S3 | largest $\Delta F3 = 2^{N_2}\Delta F2$ | K | F3 − M3ΔF3; where $0 \leq M3 \leq K$ |

Fout = F4 − [(F3 − M3ΔF3) + (F2 − M2 ΔF2) + (F1 − M1 ΔF1)]
Fout = (F4 − F3 − F2 − F1) + (M3ΔF3 + M2ΔF2 + M1ΔF1)

By design make F4(min)-F3-F2-F1 −0; where F4(min) is the minimum value of frequency F4.

Thus, Fout−M3ΔF3+M2ΔF2+M1ΔF1; where M1, M2, and M3 are integers with the limits set out in Table I above.

Thus, the number of positions for switches one and two is an exact power of two. The number of positions for switch three which controls the largest step size does not have to be an exact-power-of-two.

Choose $\Delta F1 + 2^{D_1}$ Hz: Minimum step size is an exact-power-of two Hz.

then $\Delta F2 = 2^{N_1}\Delta F1 = 2^{N_1}2^{D_1} = 2^{N_1+D_1}$ Hz.

and $\Delta F3 = 2^{N_2}\Delta F2 = 2^{N_2}2^{N_1}\Delta F1 = 2^{N_2}2^{N_1}2^{D_1} = 2^{N_2+N_1+D_1}$ Hz.

Figure 2A:
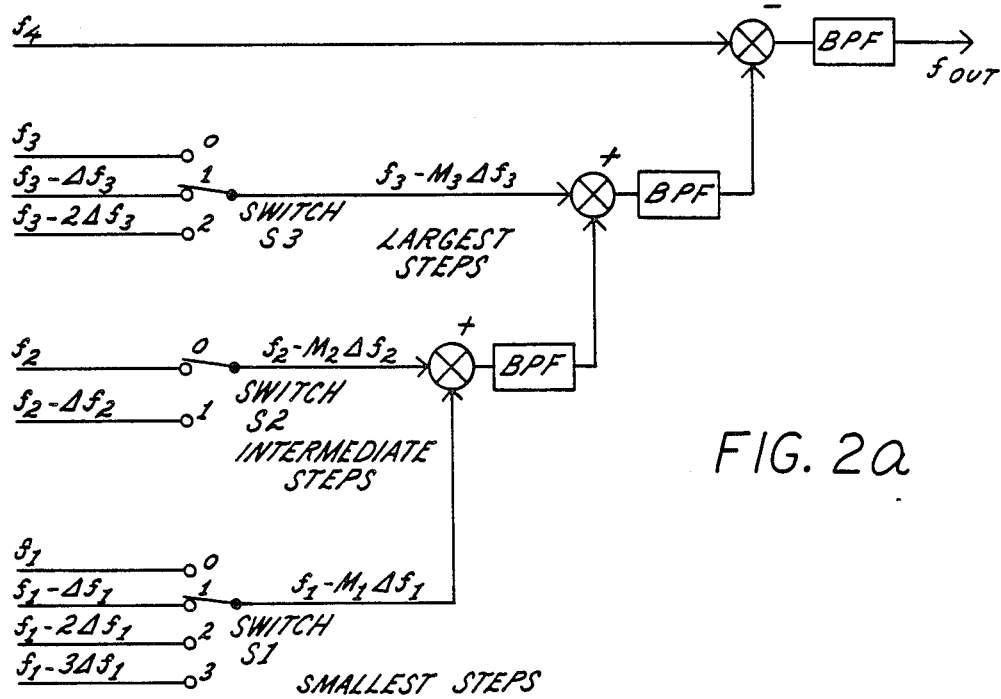
FIG. 2a shows a specific example of a frequency synthesizer constructed in accordance with the teachings of this invention.

FIG. 2a taken in conjunction with Table II shows a specific example of an exact powers of two synthesizer constructed in accordance with the teachings of this invention. There are $2^2 = 4$ frequencies available at switch S1; $2^1 = 2$ frequencies available at switch S2; and 3 (not an exact power of two) frequencies available at switch S3. Switch S3 controls the largest step size. The example of FIG. 2 also serves to demonstrate the simplified decoding provided in accordance with this invention.

$N_1 = 2$ $N_2 = 1$ $N_3 = 3$, which is not an exact power of 2

$\Delta F1 = 2^D$ $\Delta F2 = 2^{N_1}\Delta F1 = 2^2 2^D$ $\Delta F2 = 2^{D+2}$ $\Delta F3 = 2^{N_2}\Delta F2 = (2^1)(2^2 2^D)$ $\Delta F3 = 2^{D+3}$ Set F4 − F3 − F2 − F1 = 0, leaving Fout = M3ΔF3 + M2ΔF2 + M1ΔF1; or $$F_{out} = \overset{0}{1}\Delta F3 + \overset{0}{1}\Delta F2 + \overset{0}{\underset{3}{\frac{1}{2}}}\Delta F1$$

where $\frac{YA}{Z}$ means X, Y, or Z multiplies A.

Of importance, the values of M1, M2, and M3 indicate the various switch positions required to generate Fout.

Now represent M1, M2, and M3 in binary form and ΔF1, ΔF2, and ΔF3 as powers of two.

$$F_{out} = \overset{00}{\underset{10}{01}}2^{D+3} + \overset{0}{1}2^{D+2} + \overset{00}{\underset{11}{01}}2^D$$

Multiplication of a binary number by a power of two is equivalent to shifting the binary number left. The exponent of the two indicates the number of shifts.

Thus, as shown in Table II, the digital word representing the frequency is formed as:
Switch 1 position shifted D places
+switch 2 position shifted by D+2 places
+switch 3 position shifted D+3 places.

TABLE II

| | | FREQUENCY IN BINARY = NUMERICAL VALUE OF THE DATA WORD | | | | | | |
|---|---|---|---|---|---|---|---|---|
| Fout (Hz) | Switch number bit position | S3 | | S2 | S1 | | | |
| | | D + 4 | D + 3 | D + 2 | D + 1 | D | D − 1 | ... 0 |
| 0 | | 0 | 0 | 0 | 0 | 0 | 0 | 0 |
| $2^D$ | | 0 | 0 | 0 | 0 | 1 | 0 ... | 0 |
| $2 \times 2^D$ | | 0 | 0 | 0 | 1 | 0 | 0 | 0 |
| $3 \times 2^D$ | | 0 | 0 | 0 | 1 | 1 | 0 | 0 |
| $4 \times 2^D$ | | 0 | 0 | 1 | 0 | 0 | 0 | 0 |
| $5 \times 2^D$ | | 0 | 0 | 1 | 0 | 1 | 0 | 0 |
| $6 \times 2^D$ | | 0 | 0 | 1 | 1 | 0 | 0 | 0 |
| $7 \times 2^D$ | | 0 | 0 | 1 | 1 | 1 | 0 | 0 |
| $8 \times 2^D$ | | 0 | 1 | 0 | 0 | 0 | 0 | 0 |
| $9 \times 2^D$ | | 0 | 1 | 0 | 0 | 1 | 0 ... | 0 |
| $10 \times 2^D$ | | 0 | 1 | 0 | 1 | 0 | 0 | 0 |
| $11 \times 2^D$ | | 0 | 1 | 0 | 1 | 1 | 0 | 0 |
| $12 \times 2^D$ | | 0 | 1 | 1 | 0 | 0 | 0 | 0 |
| $13 \times 2^D$ | | 0 | 1 | 1 | 0 | 1 | 0 | 0 |
| $14 \times 2^D$ | | 0 | 1 | 1 | 1 | 0 | 0 | 0 |
| $15 \times 2^D$ | | 0 | 1 | 1 | 1 | 1 | 0 | 0 |

TABLE II-continued

| | | FREQUENCY IN BINARY = NUMERICAL VALUE OF THE DATA WORD | | | | | |
|---|---|---|---|---|---|---|---|
| Fout | Switch number | S3 | | S2 | S1 | | |
| (Hz) | bit position | D + 4 | D + 3 | D + 2 | D + 1 | D | D − 1 ... 0 |
| $16 \times 2^D$ | | 1 | 0 | 0 | 0 | 0 | 0       0 |
| $17 \times 2^D$ | | 1 | 0 | 0 | 0 | 1 | 0 ...   0 |
| $18 \times 2^D$ | | 1 | 0 | 0 | 1 | 0 | 0       0 |
| $19 \times 2^D$ | | 1 | 0 | 0 | 1 | 1 | 0       0 |
| $20 \times 2^D$ | | 1 | 0 | 1 | 0 | 0 | 0       0 |
| $21 \times 2^D$ | | 1 | 0 | 1 | 0 | 1 | 0       0 |
| $22 \times 2^D$ | | 1 | 0 | 1 | 1 | 0 | 0       0 |
| $23 \times 2^D$ | | 1 | 0 | 1 | 1 | 1 | 0       0 |

Referring to Table II, the shift left (or multiplication) is equivalent to concatenating a string of zeros onto the right side of the original number—one zero for each shift. Switch S1 has four positions which are represented by bits in bit positions D and D+1. The data for the position of switch S2 is shifted two bits further than the data for switch S1, and thus the two switch positions of switch S2 are represented by the bits in position D+2. Switch S3 has three positions, which are represented by the bits in positions D+3 and D+4.

Decoding the control word (which equals Fout in binary) into switch positions is thus straight forward and simple. Specific bits always control specific switches without overlapping. Since switches S1 and S2 have numbers of positions that are exact powers of two, there are no gaps in frequency coverage.

The switch that controls the largest steps (switch S3 in this example) need not have an exact- power-of-two number of positions, because the frequencies it controls do not have to be continuous with a larger step size.

Figure 2B:
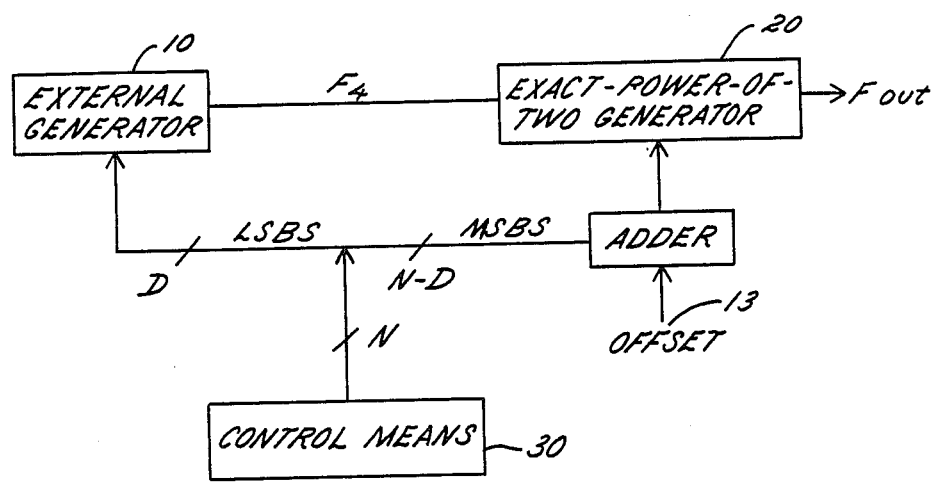
FIG. 2b shows an example of a frequency synthesizer constructed in accordance with the teachings of this invention which includes an external generator.

The specific example of FIG. 2a shows frequency F4 as a fixed frequency. However, if desired frequency F4 is a variable frequency signal, for example, if either finer resolution or increased frequency coverage is desired. If frequency F4 is a variable frequency signal, it is preferable to also make it step with an increment that is an exact-power-of-two. Then, as shown in FIG. 2b, a single binary control word having N bits and provided by controls means 30 can be used to specify Fout, with specific bits controlling frequency F4 to be provided by external generator 10 (for example the D bits in bit positions D-1 to 0), and other specific bits (for example the remaining N-D bits) of the control word controlling the frequency provided by the exact-power-of two generator 20. This is particularly advantageous when the frequency F4 is generated by a direct digital frequency synthesizer, such as the generator described in U.S. Pat. No. 4,454,486 issued June 12, 1984 to Kovalick and Hassun and assigned to Hewlett-Packard company, the assignee of this invention.

In another embodiment of the structure of Fig. 2b, frequency F4 is provided by an arbitrary waveform generator serving as external generator 10. Regardless whether frequency F4 is of fixed or variable frequency, it can also be a modulated signal, having any combination of amplitude, phase, and frequency modulation, in which event the modulation of frequency P4 appears on the output signal having a frequency Fout. Thus, the signal at frequency F4 is in effect translated to frequency Fout, with modulation remaining intact. If desired, the modulating data and/or characteristics (i.e. A.M., F.M., SSB, etc), and the amplitude of the output signal, can be specified with additional bits making up the control word, for example bits in bit positions D+5 and above.

Referring again to FIG. 2a, an example of direct frequency synthesis using exact-powers-of-two in accordance with this invention is depicted. In some instances the practical limitations of circuit performance, particularly with regard to mixer spurious signal generation, make it necessary to first generate an intermediate frequency (IF) signal which is then upconverted or down-converted by the use of mixers to the desired output frequency Fout. In some cases it may be necessary to have more than one IF in order to meet specific design requirements. The IF mixer stages may also be used to sum in additional frequency increments, which may be either finer or coarser than the increments provided by the circuit of FIG. 2a.

If desired, the frequencies (i.e. F1, F2, F3...) can be selected such that the equation assumed above regarding their relationships does not hold true, i.e.

$$F4(min) - F3 - F2 - F1 \neq 0$$

In this event, the digital word specifying the frequency to be generated must be derived by adding a specific offset factor to values provided by the frequency selector switches. Thus for example, if F4−F3−F2−F1 ≠ −150 MHz, the binary value of 150 MHz must be added to the digital word provided to the frequency selector switches in order to cause the frequency synthesizer to provide an output signal having the desired output frequency specified by the binary word. Referring to FIG. 2b, this offset data 13 is added by adder 11. This approach may be helpful in allowing greater flexibility in the selection of the frequencies used, for example to provide frequencies which are easily derived or which are easily mixed and filtered. Of importance, the offset value must be an integer multiple of the smallest step size.

If desired, specific delay times may be used to delay application of control bits to the switches by a selected amount for each switch. In this manner, the operations of the circuit are precisely timed such that, in response to a change in the control word, the output signal makes a single transition from the current state to the new state, thereby avoiding undesired intermediate states.

Figure 3B:
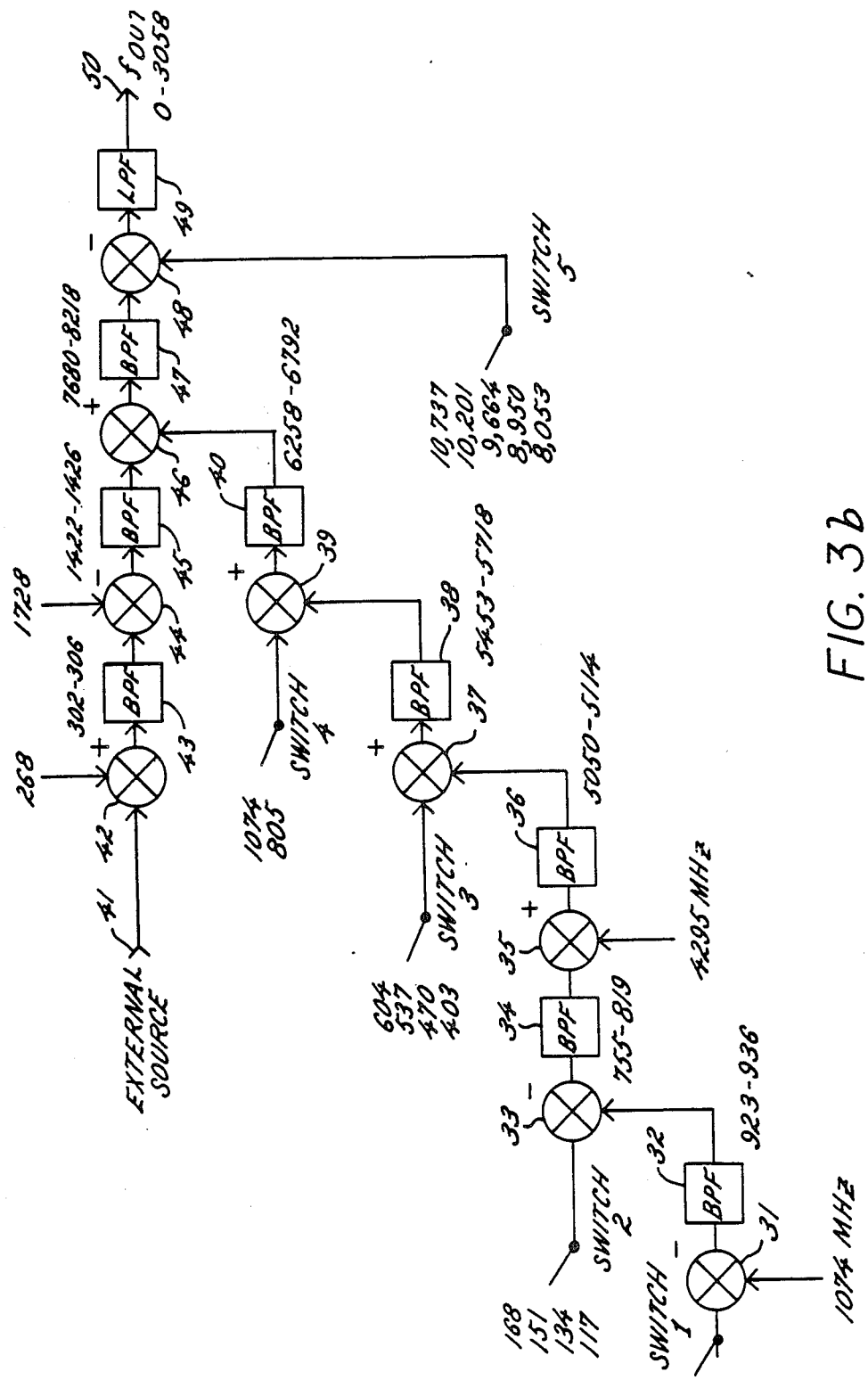
FIG. 3b is a block diagram of one embodiment of a direct frequency synthesizer constructed in accordance with the teachings of this invention.
Figure 3A:
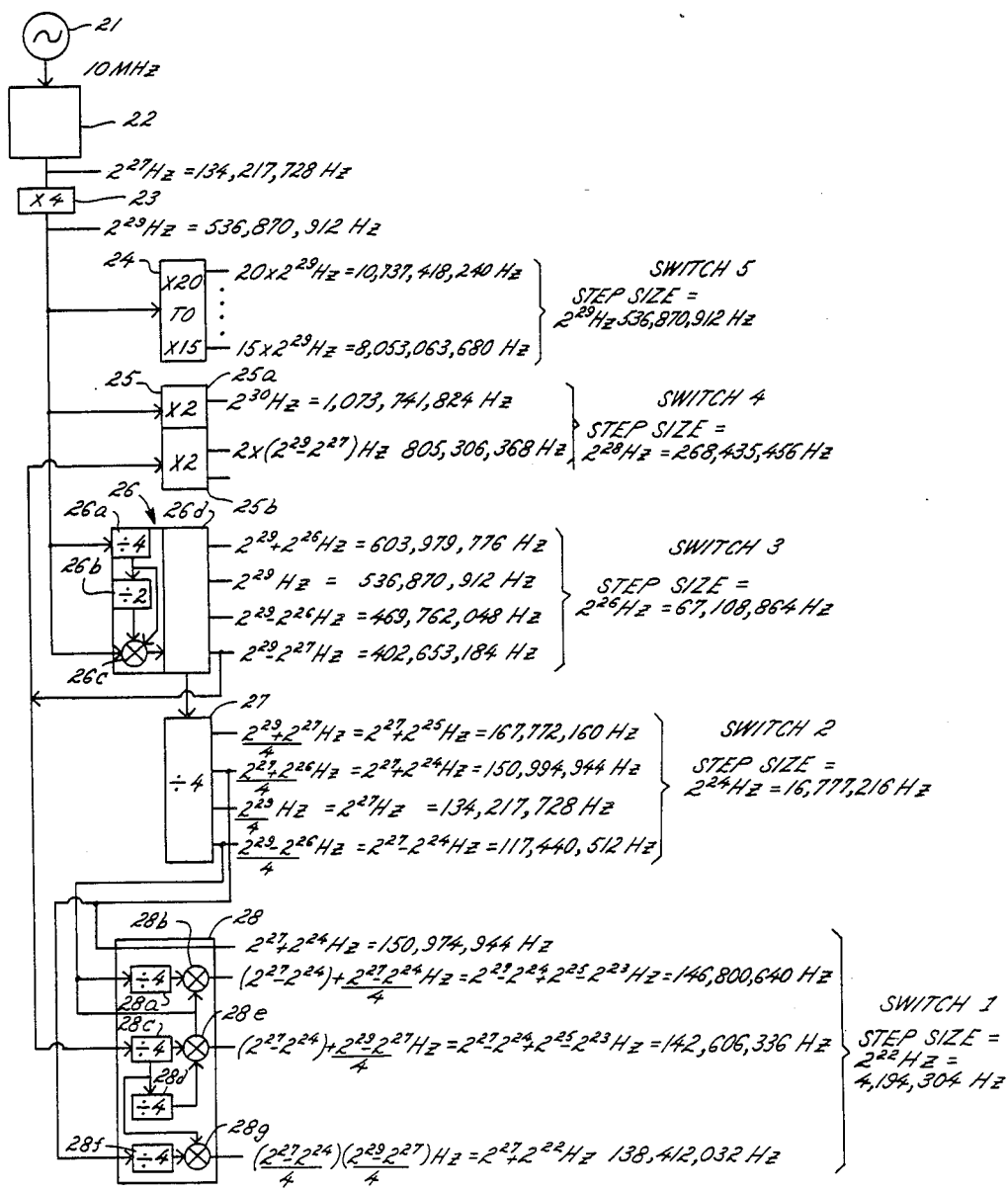
FIG. 3a is a block diagram of a structure for providing the specific signals used in the structure of FIG. 3b.

A specific example of an exact-powers-of-two direct synthesizer incorporating IF circuit blocks is shown in FIGS. 3a and 3b, with FIG. 3a depicting how the various frequencies used in the circuit of FIG. 3b are derived.

Referring to FIG. 3a, phase lock loop 22 locks an internal 134,217,728 Hz=$2^{27}$ oscillator to a 10 MHz reference signal provided by reference oscillator 21, as is described in a copending U.S. Pat. application on an invention of Carp et. al., entitled "Method and Structure for Synthesizing $2^C$ Hz from a $2^{A.5B}$ Hz Oscillator", now U.S. Pat. No. 4,745,373, issued May 17, 1988. The 134,217,728 Hz signal is applied to multiplier circuit 23 where two cascaded frequency doubler circuits multiply it to 536,870,912 Hz ($2^{29}$). In this embodiment, this one reference frequency is the basis from which all other internal signals are derived.

The 536,870,912 Hz signal is applied to harmonic comb generator 24, which includes suitable filters to select the 15th through 20th harmonic of the 536,870,921 Hz reference signal. Thus, harmonic comb generator 24 provides to switch 5 the largest step size of 536,870,912 Hz ($2^{29}$) between six frequencies ranging from 8,053,063,680 to 10,737,418,240 Hz.

Multiplier circuit 25 provides the next largest step size of 268,435,456 Hz ($2^{28}$) between the two frequencies of 1,073,741,824 Hz and 805,306,368 Hz. The 1,073,741,824 Hz signal is provided by multiplier 25a, which multiplies the 536,870,912 Hz reference signal by two. The 805,306,368 Hz signal is provided by multiplier 25b, which multiplies a 402,653,184 Hz . signal by two. This 402,653,184 Hz signal is derived in a manner which is subsequently explained. These two signals are applied to switch 4.

The 536,870,912 Hz signal is also applied to circuit 26, which includes divide-by-4 and divide-by-2 circuits 26a and 26b, which provide output signals of 134,217,728 Hz and 67,108,864 Hz, respectively, which are mixed with the original 536,870,912 Hz signal in mixer in 26c. Mixer 26c output signals at 671,088,640; 603,979,776; 469,762,048 and 402,653,184 Hz are filtered by four separate filters contained within filter assembly 26d. The three lowest frequencies and the 536,870,912 Hz reference signal form a set of four signals spaced 67,108,864 Hz ($2^{26}$) selectable by switch 3.

The 402,653,184 Hz signal from filter assembly 26d is also applied to frequency doubler 25b, which provides an output signal at 805,306,368 Hz, as previously described.

Signals from filter assembly 26d are also further divided by a plurality of divide-by-four circuits in block 27 to generate a set of four frequencies from 167,722,160 Hz to 117,440,512 Hz spaced by 16,777,216 Hz ($2^{24}$) selectable by switch 2.

Block 28 also provides four output signals ranging in frequency from 150,994,944 Hz to 138,412,032 Hz, spaced by 4,194,304 Hz ($2^{22}$) which are selectable by switch 1. The 150,994,944 Hz is provided as described above with regard to divider block 27. The next frequency, 146,800,640 Hz is provided by adding the 117,440,512 Hz signal from divider block 27 with a signal having a frequency of ¼ the 117,440,512 Hz signal which is provided by divide-by-four circuit 28a. The 142,606,336 Hz signal is provided by mixer 28e which adds the 117,440,512 Hz signal from divider block 27 to a signal having provided by dividers 28c and 28d having a frequency 1/16 that of the 402,653,184 Hz signal provided by filter assembly 26d. Similarly, the 138,412,032 Hz signal is provided by mixer 28g which adds a signal from divider circuit 28c having a frequency of ¼ that of the 402,653,184 Hz signal from filter assembly 26d with the signal from divider circuit 28f having a frequency of ¼ that of the 150,994,944 Hz signal provided by divider block 27.

Naturally, FIG. 3A shows but one example of a structure suitable for deriving signals having appropriate frequencies for use in accordance with the teachings of this invention. Other frequencies can be selected, and other techniques for deriving these frequencies can be used in accordance with the teachings of this invention.

Referring to FIG. 3B, frequencies will be shown in MHz only, for sake of simplicity. However, the actual values of those frequencies available to switches 1 through 5 are as shown in FIG. 3A, as previously described. Referring to FIG. 3B, the $2^{22}$ Hz step sizes available to switch 1 are mixed by mixer 31 in order to subtract them from a signal having a frequency of 1074 MHz, which can be derived in any convenient fashion. The output signal of mixer 31 is provided to band-pass filter 32, which provides an output signal within the range 923-936 MHz, having step sizes of $2^{22}$ Hz. This signal is applied to mixer 33 which subtracts therefrom the frequency selected by switch 2, having step sizes of $2^{24}$ Hz. The result is applied to band pass filter 34, providing a signal having a frequency within a range of 755-819 MHz having a course adjustment of $2^{24}$ Hz and a fine adjustment of $2^{22}$ Hz. This is applied to the mixer 35 for addition with a 4295 MHz signal, with the result being applied to band pass filter 36 which provides a frequency within the range of 5050-5114 MHz. This is in turn applied to mixer 37 which adds the frequency selected by switch 3, having step size equal to $2^{26}$ Hz. The result is applied to band pass filter 38 which provides a frequency within the range of 5453-5718 MHz, having three step sizes: $2^{26}$ Hz, $2^{24}$ Hz, and $2^{22}$ Hz. This signal is applied to mixer 39 which adds the frequency selected by switch 4 having a step size of $2^{28}$ Hz. The result is applied to band pass filter 40 which provides a frequency within the range of 6258-6792 MHz having four available step sizes. The signal is applied to mixer 46 which adds the signal available from band pass filter 45. The signal available from band pass filter 45 has a frequency within the range of 1422-1426 MHz, as provided by an external source 41, and mixed and filtered by mixers 42 and 44, and filters 43 and 45. The output from mixer 46 is applied to bandpass filter 47, which yields a signal having a frequency within the range of 7680-8218 MHz, which is then applied to mixer 48 which subtracts the frequency available from band pass filter 47 from a frequency selected by switch 5. The results are applied to low pass filter 49 which in turn provide output frequency fout within the range of 0-3058 MHz on output lead 50.

The example of FIG. 2a shows how F1, F2, F3 and F4 affect the output frequency. In the specific embodiment of the invention being described in detail here, the frequencies of various signals affect the frequency of the output signal in the same manner. In this example, however, there are more than four such fixed offset frequencies. Referring to FIG. 3b, it is seen that the $2^{22}$ Hz steps have a frequency offset of 138 MHz and there is an upconversion with a 1074 MHz signal. The $2^{24}$ Hz steps have a frequency offset of 117 MHz and there is an upconversion which introduces an offset of 4295 MHz. The $2^{26}$ Hz steps have a frequency offset of 604 MHz, and the $2^{28}$ Hz steps have a frequency offset of 1074 MHz. External source 41 has a frequency offset of 37 MHz, and there is a first upconversion that introduces an offset of 268 MHz and a second upconversion with a 1728 MHz signal. All of these frequency conversions result in mixer 46 output signal of approximately 8 GHz. This signal is mixed with the $2^{29}$ Hz steps in output mixer 48. The $2^{29}$ Hz steps have a frequency offset of approximately 8 GHz which cancels the 8 GHz offset of the mixer 46 output signal, enabling the output frequency to extend down to low (approximately zero MHz) frequencies.

In one embodiment of the invention, an external signal source is applied to terminal 41 which provides a variable frequency signal. For example, a direct digital synthesizer or an arbitrary waveform generator as described above can be used to provide an external signal having a frequency range from 10 MHz to 60 MHz and step sizes of 0.25 Hz thereby providing "fine" resolution in addition to the "coarse" resolution of the remainder of the circuit. Thus, in accordance with the teachings of this invention, a relatively low range to provide fine resolution, and novel circuitry is employed to provide the coarse tuning adjustments. If desired, such a direct digital synthesizer may be kept in a desired frequency band, for example 13–58 MHz, in order to ease filtering requirements. In this event, a binary offset word is added to the least significant bits of the control word, since the least significant bits of the control word are controlling the direct digital synthesizer.

In an alternative embodiment of the invention, a fixed frequency signal is applied to the input of mixer 42, rather than the signal from an external source. In this embodiment the output signal covers the same frequency range as the embodiment described above and has a resolution of 4,194,304 Hz ($=2^{22}$ Hz).

All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A signal generator for producing an output signal having an output frequency determined by a digital control word, the signal generator comprising:
   means for producing a plurality of sets of reference signals, each set having a plurality of reference signals each having a reference frequency differentiated from reference frequencies of other reference signals in the set by a multiple of an integral power of two;
   a plurality of means for selecting, each receiving one or more selected bits of the digital control word and the reference signals from one set for selecting according to the digital control word one reference signal from each set as a selected signal having a selected frequency; and
   means responsive to the selected signals for mathematically combining the selected frequencies of the selected signals to produce the output signal having the output frequency which is a mathematical combination of the selected frequencies of each selected signal, wherein application of selected bits to said means for selecting is delayed by a time unique to each said means for selecting, such that any changes in selection of reference signals caused by a change in the control word have simultaneous effect on said output signal.

2. A signal generator for producing an output signal having an output frequency determined by a digital control word, the signal generator comprising:
   means for producing a plurality of sets of reference signals, each set having a plurality of reference signals each having a reference frequency differentiated from reference frequencies of other reference signals in the set by a multiple of an integral power of two;
   a plurality of means for selecting, each receiving one or more bits of the digital control word and the reference signals from one set for selecting according to the digital control word one reference signal from each set as a selected signal having a selected frequency; and
   means responsive to the selected signals for mathematically combining the selected frequencies of the selected signals to produce the output signal having the output frequency which is a mathematical combination of the selected frequencies of each selected signal, wherein a binary offset word is added to said digital control word to cause the output signal to have a desired frequency.

3. A signal generator for producing an output signal having an output frequency determined by a digital control word, the signal generator comprising:
   means for producing a plurality of sets of reference signals, each set having a plurality of reference signals each having a reference frequency differentiated from reference frequencies of other reference signals in the set by a multiple of an integral power of two;
   a plurality of means for selecting, each receiving one or more bits of the digital control word and the reference signals from one set for selecting according to the digital control word one reference signal from each set as a selected signal having a selected frequency; and
   means responsive to the selected signals for mathematically combining the selected frequencies of the selected signals to produce the output signal having the output frequency which is a mathematical combination of the selected frequencies of each selected signal;
   wherein the relative phases of the various reference signals are unaffected by any selections made by the means for selecting, whereby the output signal maintains phase memory when said output signal is adjusted from a first frequency, to one or more frequencies other than said first frequency, and is returned to said first frequency.

4. A signal generator for producing an output signal having an output frequency determined by a digital control word, the signal generator comprising:
   means for producing a plurality of sets of reference signals, each set having a plurality of reference signals each having a reference frequency differentiated from reference frequencies of other reference signals in the set;
   a plurality of means for selecting, each receiving one or more selected bits of the digital control word and the reference signals from one set for selecting according to the digital control word one reference signal from each set as a selected signal having a selected frequency; and
   means responsive to the selected signals for mathematically combining the selected frequencies of the selected signals to produce the output signal having the output frequency which is a mathematical combination of the selected frequencies of each selected signal, wherein application of selected bits to said means for selecting is delayed by a time unique to each said means for selecting, such that any changes in selection of reference signals caused by a change in the control word have simultaneous effect on said output signal.

5. A signal generator for producing an output signal having an output frequency determined by a digital control word, the signal generator comprising:

means for producing a plurality of sets of reference signals, each set having a plurality of reference signals each having a reference frequency differentiated from reference frequencies of other reference signals in the set;

a plurality of means for selecting, each receiving one or more bits of the digital control word and the reference signals from one set for selecting according to the digital control word one reference signal from each set as a selected signal having a selected frequency; and means responsive to the selected signals for mathematically combining the selected frequencies of the selected signals to produce the output signal having the output frequency which is a mathematical combination of the selected frequencies of each selected signal, wherein a binary offset word is added to said digital control word to cause the output signal to have a desired frequency.

6. A signal generator for producing an output signal having an output frequency determined by a digital control word, the signal generator comprising:

means for producing a plurality of sets of reference signals, each set having a plurality of reference signals each having a reference frequency differentiated from reference frequencies of other reference signals in the set;

a plurality of means for selecting, each receiving one or more bits of the digital control word and the reference signals from one set for selecting according to the digital control word one reference signal from each set as a selected signal having a selected frequency; and means responsive to the selected signals for mathematically combining the selected frequencies of the selected signals to produce the output signal having the output frequency which is a mathematical combination of the selected frequencies of each selected signal;

wherein the relative phases of the various reference signals are unaffected by any selections made by the means for selecting, whereby the output signal maintains phase memory when said output signal is adjusted from a first frequency, to one or more frequencies other than said first frequency, and is returned to said first frequency.

7. The signal generator of claims 1, 2, or 3 wherein the difference between reference frequencies for reference signals in the same set having adjacent reference frequencies is an integral power of two.

8. The signal generator of claims 1, 2, or 3 wherein the number of reference signals in each set of reference signals is an integral power of two.

9. The signal generator of claims 1, 2, or 3 wherein the difference between the reference frequencies of adjacent reference signals in a set is equal and is equal to the number of reference signals in an adjacent and lower set times the difference between the reference frequencies of the adjacent and lower reference signals.

10. The signal generator of claims 1, 2, or 3 wherein the control signal is composed of a plurality of binary digits, and each means for selecting is controlled by a plurality of binary digits from the binary word such that no binary digit of the control signal is used by more than one means for selecting.

11. The signal generator of claim 10 wherein the binary digits of the control signal are directly used by the means for selecting.

12. The signal generator of claims 1, 2, or 3 wherein said mathematical combination is a sum.

13. A signal generator as in claims 1, 2, or 3 wherein one of said sets provides a reference signal which is modulated, and said output signal is modulated in a similar manner.

14. A signal generator as in claims 1, 2, or 3 wherein at least one of said plurality of sets of reference signals is provided by a direct digital synthesizer.

15. A signal generator as in claims 1, 2, or 3 wherein at least one of said plurality of sets of reference signals is provided by an arbitrary waveform generator.

16. A signal generator as in claim 14 wherein said means for selecting are controlled by a first set of bits of a binary control word and the frequency of said direct digital synthesizer is controlled by a second set of bits of a binary control word.

17. A signal generator as in claim 15 wherein said means for selecting are controlled by a first set of bits of a binary control word and the frequency of said arbitrary waveform generator is controlled by a second set of bits of a binary control word.

18. A signal generator as in claim 16 wherein selected bits of said binary control word serve to control one or more characteristics of at least one of said plurality of sets of reference signals.

19. A signal generator as in claim 18 wherein said characteristics are selected from the group of characteristics consisting of frequency, modulation information, modulation type, modulation amplitude, and signal level.

20. A signal generator as in claim 17 wherein selected bits of said binary control word serve to control one or more characteristics of at least one of said plurality of sets of reference signals.

21. A signal generator as in claim 20 wherein said characteristics are selected from the group of characteristics consisting of frequency, modulation information, modulation type, modulation amplitude, and signal level.

22. A signal generator as in claims 1, 2, or 3 wherein one of the selected signals is modulated and is upconverted by the means responsive to the selected signals in order to provide a modulated output signal.

23. A signal generator as in claims 1, 2, or 3 wherein one of the selected signals is provided by a direct digital synthesizer and is upconverted by the means responsive to the selected signals in order to provide the output signal.

24. A signal generator as in claims 1, 2, or 3 wherein one of the selected signals is provided by an arbitrary waveform generator and is upconverted by the means responsive to the selected signals in order to provide the output signal.

* * * * *